United States Patent
Karpov et al.

(10) Patent No.: US 6,794,268 B2
(45) Date of Patent: Sep. 21, 2004

(54) FABRICATING DEEPER AND SHALLOWER TRENCHES IN SEMICONDUCTOR STRUCTURES

(75) Inventors: Ilya Karpov, Santa Clara, CA (US); Tony Ozzello, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 10/209,204

(22) Filed: Jul. 31, 2002

(65) Prior Publication Data

US 2004/0023467 A1 Feb. 5, 2004

(51) Int. Cl.$^7$ .............................................. H01L 21/76
(52) U.S. Cl. ...................................... 438/427; 438/424
(58) Field of Search ........................................ 438/427

(56) References Cited

U.S. PATENT DOCUMENTS

| | | | | |
|---|---|---|---|---|
| 5,298,450 A | * | 3/1994 | Verret ........................ 438/207 |
| 5,460,987 A | * | 10/1995 | Wen et al. ................... 438/151 |
| 5,574,302 A | * | 11/1996 | Wen et al. ................... 257/330 |
| 5,666,002 A | * | 9/1997 | Yamamoto et al. .......... 257/621 |
| 5,895,253 A | * | 4/1999 | Akram ........................ 438/424 |
| 5,904,540 A | * | 5/1999 | Sheng et al. ................ 438/427 |
| 5,963,838 A | * | 10/1999 | Yamamoto et al. .......... 438/766 |
| 6,399,449 B1 | * | 6/2002 | Matsumoto .................. 438/296 |
| 6,461,934 B2 | * | 10/2002 | Nishida et al. .............. 438/424 |

\* cited by examiner

*Primary Examiner*—Long Pham
(74) *Attorney, Agent, or Firm*—Trop, Pruner & Hu, P.C.

(57) ABSTRACT

Crossing trenches of different depths may be formed in the same semiconductor structure by etching the deeper trench first. The deeper trench and the substrate may then be covered with a material that prevents further etching. The covering is etched through for the shallower trench, leaving a protective covering in the deeper trench.

6 Claims, 2 Drawing Sheets

FABRICATING DEEPER AND SHALLOWER TRENCHES IN SEMICONDUCTOR STRUCTURES

BACKGROUND

This invention relates generally to forming trenches such as trenches for isolation purposes, in the fabrication of microelectronic integrated circuits.

In some cases, it is desirable to form trench isolations with two different trench depths. Conventionally this may be done by forming a trench of a first depth, covering the formed trench, and forming a trench of a second depth. Trenches of different depth that run parallel to one another may be formed by etching the shallow trench and then the deep trench. More particularly, both the shallow and the deep trench may be formed to the shallow depth. Then one shallow trench may be protected, for example with resist, leaving one of the shallow trenches unprotected. The unprotected shallow trench is then extended with etching to form the deeper trench.

However, this approach does not work when the trenches cross one another. For example, if two shallow trenches are etched across one another and then one of the trenches is protected with a resist while the other trench is deepened, the deeper trench has a bump where it crosses the shallow trench because of the protection applied in the shallow trench.

Thus, there is a need for better ways to fabricate trenches at different depths that cross one another.

DETAILED DESCRIPTION

Figure 1:
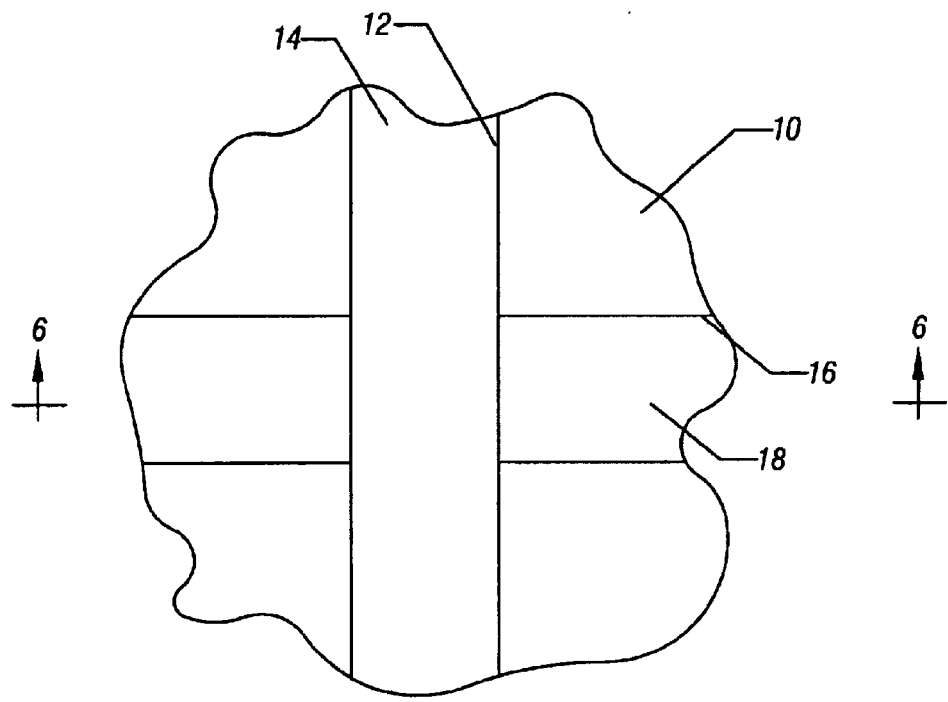
FIG. 1 is an enlarged top plan view of one embodiment of the present invention.

Referring to FIG. 1, a deeper trench 12 may cross a shallower trench 16. Each of the trenches may be formed in the same wafer 10. The trench 12 may be filled with a fill material 14 and the trench 16 may be filled with a fill material 18.

Figure 2:
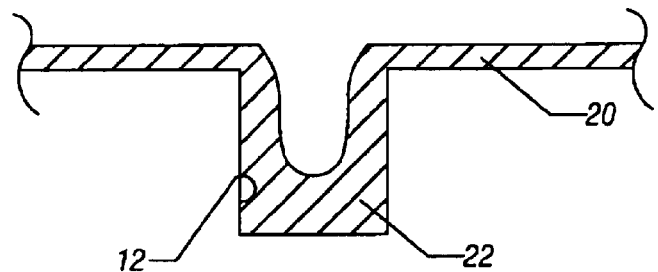
FIG. 2 is an enlarged cross-sectional view at an early stage of manufacture of the structure shown in FIG. 1 in accordance with one embodiment of the present invention.

Initially, the deeper trench 12 may be formed and may be filled with an appropriate protective layer including a portion 20 on the surface of the wafer 10 and a portion 22 that collects down in the trench 12 as shown in FIG. 2. Because of the topography of the trench 12, more of the fill material 22 may collect within the trench 12 than on the surface of the wafer 10. Thus, the thickness of protective material 22 may be greater than the thickness of the protective material 20. The protective material 20, 22 may be resist, spin-on glass, or spin-on polymer, to mention a few examples.

Figure 3:
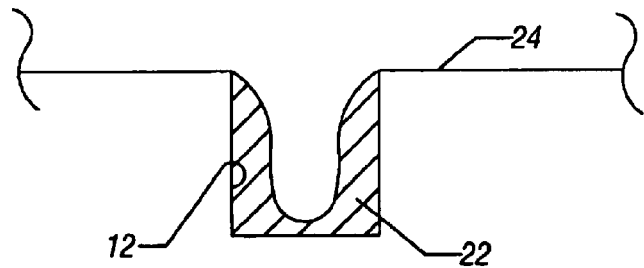
FIG. 3 is a cross-sectional view corresponding to FIG. 2 at a later stage of manufacture.

Thereafter, the material 20 may be removed from the surface of the wafer 10 using an appropriate etching process. However, because of the greater thickness of the material 22 within the trench 12, a substantial portion of that material remains as indicated in FIG. 3. This remaining material 22 is effective to protect the trench 12 during the etching of the shallower trench 16.

Figure 4:
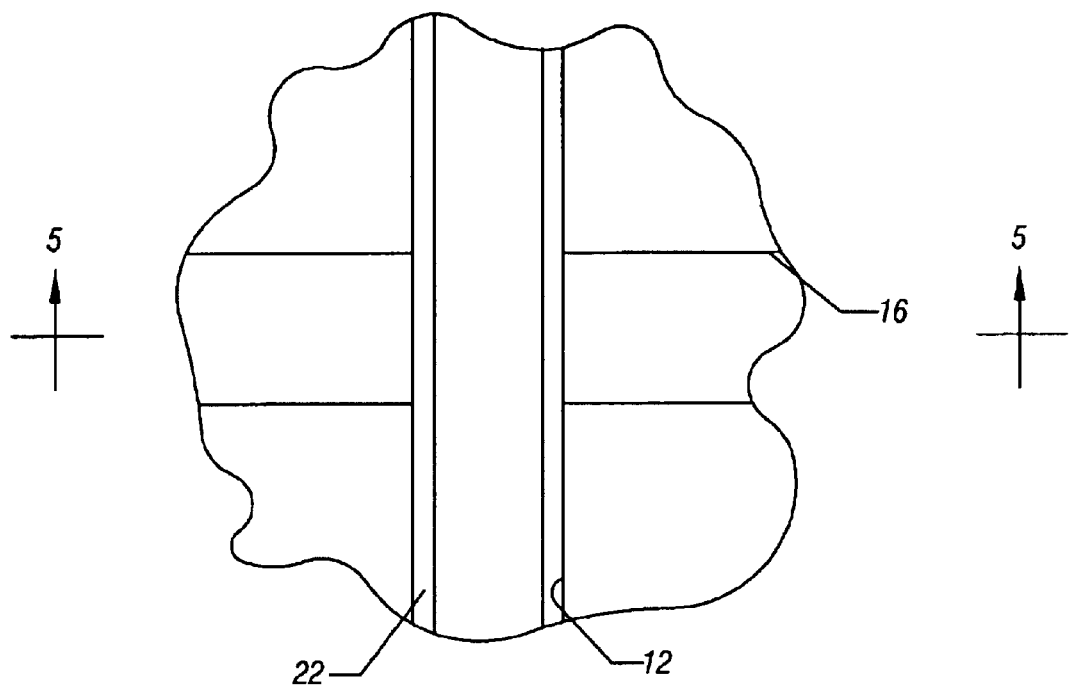
FIG. 4 is a top plan view at a subsequent stage of manufacture in accordance with one embodiment of the present invention.
Figure 5:
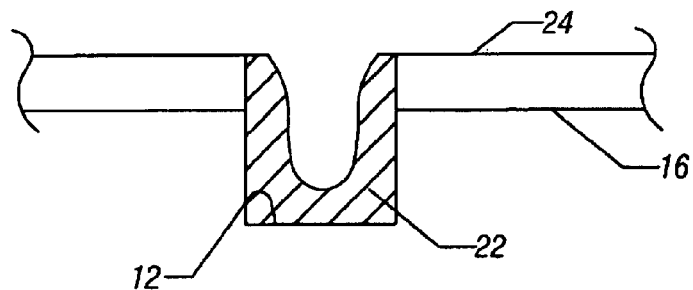
FIG. 5 is a cross-sectional view taken generally along the line 5—5 in FIG. 4.
Figure 6:
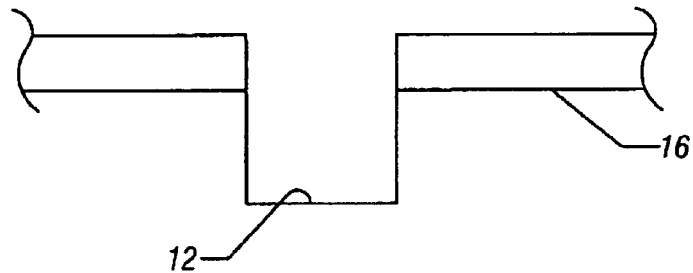
FIG. 6 is a cross-sectional view taken generally along the line 6—6 in FIG. 1.

Referring to FIG. 4, the shallower trench 16 may be etched with the material 22 still in the trench 12. As shown in FIG. 5, the shallower trench 16 may be etched with the upstanding material 22 remaining in the deep trench. Thereafter, the fill material 22 may be cleaned as shown in FIG. 6.

As a result, the deeper trench 12 may be formed first and the shallower trench 16 may be formed second without the problem of creating an irregularity where the trenches cross.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming in a structure a first trench and then a second trench wherein said first trench is deeper than said second trench;

covering said deeper trench while forming said shallower trench by forming a covering over said deeper trench that is thicker in said deeper trench than over said structure; and defining an opening on said structure through said covering and etching said shallower trench.

2. The method of claim 1 including covering said deeper trench in said structure with spin-on glass.

3. The method of claim 1 wherein covering said deeper trench includes covering said deeper trench with a layer of material having a thickness of less than the depth of said deeper trench.

4. The method of claim 3 including covering said deeper trench with a layer of material having a thickness of less than the depth of said deeper trench.

5. The method of claim 4 including forming two trenches of different depths using only one polishing step.

6. The method of claim 5 including polishing both trenches together in the same step after both trenches have been formed.

* * * * *